(12) United States Patent
Tzartzanis et al.

(10) Patent No.: US 7,307,483 B2
(45) Date of Patent: Dec. 11, 2007

(54) ELECTRONIC OSCILLATORS HAVING A PLURALITY OF PHASED OUTPUTS AND SUCH OSCILLATORS WITH PHASE-SETTING AND PHASE-REVERSAL CAPABILITY

(75) Inventors: Nestor Tzartzanis, Belmont, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 11/347,460

(22) Filed: Feb. 3, 2006

(65) Prior Publication Data
US 2007/0182497 A1 Aug. 9, 2007

(51) Int. Cl.
*H03B 27/00* (2006.01)
(52) U.S. Cl. .......................... 331/57; 331/45; 327/269; 327/274
(58) Field of Classification Search ................. 331/57, 331/45; 327/269, 274
See application file for complete search history.

(56) References Cited

U.S. PATENT DOCUMENTS

| | | | |
|---|---|---|---|
| 5,777,501 A * | 7/1998 | AbouSeido | 327/274 |
| 6,525,618 B2 | 2/2003 | Wood | |
| 6,556,089 B2 | 4/2003 | Wood | |
| 6,777,994 B2 * | 8/2004 | Chou et al. | 327/269 |
| 6,816,020 B2 | 11/2004 | Wood | |
| 7,106,142 B2 * | 9/2006 | Lin | 331/57 |
| 7,161,438 B2 | 1/2007 | Wood | |
| 7,203,914 B2 | 4/2007 | Wood | |
| 7,218,180 B2 | 5/2007 | Wood | |
| 2002/0190805 A1 | 12/2002 | Wood | |
| 2003/0151465 A1 | 8/2003 | Wood | |

(Continued)

FOREIGN PATENT DOCUMENTS

GB 2358563 7/2001

(Continued)

OTHER PUBLICATIONS

John Wood, Terence C. Edwards and Steve Lipa, "Rotary Traveling-Wave Oscillator Arrays: A New Clock Technology," IEEE Journal of Solid-State Circuits, Nov. 2001, pp. 1654-1665, vol. 36, No. 11, IEEE, New York, USA.

(Continued)

*Primary Examiner*—Joseph Chang
(74) *Attorney, Agent, or Firm*—Baker Botts L.L.P.

(57) ABSTRACT

Disclosed are multiphase oscillators comprising a plurality of delay stages serially coupled in a loop by a plurality of nodes, with the loop being folded to provide two concentric rings of delay stages with equal numbers of allocated nodes. A second plurality of negative-resistance elements are provided, each element having a first output coupled to a node on the first concentric ring and a second output coupled to a node on the second concentric ring. Each such output switches between first and second voltage levels, and provides a negative resistance to a signal coupled to it during at least a portion of the transition between voltage levels. The outputs of an element switch to opposite voltage levels. With this construction, a high-voltage pulse propagates around the loop of delay stages, with a low-voltage pulse propagating behind it. Also disclosed are circuits to control the direction of pulse propagation.

20 Claims, 7 Drawing Sheets

U.S. PATENT DOCUMENTS

| | | |
|---|---|---|
| 2005/0225365 A1 | 10/2005 | Wood |
| 2005/0251775 A1 | 11/2005 | Wood |
| 2006/0022720 A1 | 2/2006 | Wood |
| 2006/0071844 A1 | 4/2006 | Wood |
| 2006/0082418 A1 | 4/2006 | Wood |
| 2006/0097803 A1 | 5/2006 | Wood |

FOREIGN PATENT DOCUMENTS

| | | |
|---|---|---|
| GB | 2399243 | 9/2004 |
| WO | WO 0044093 | 7/2000 |
| WO | WO 0167603 | 9/2001 |
| WO | WO 0189088 | 11/2001 |
| WO | WO 03048979 | 6/2003 |
| WO | WO 03069452 | 8/2003 |

OTHER PUBLICATIONS

Afshin Momtaz, et al., "A Fully Integrated SONET OC-48 Transceiver in Standard CMOS," IEEE Journal of Solid-State Circuits, Dec. 2001, pp. 1964-1973, vol. 36, No. 12, IEEE, New York, USA.

Ali Hajimiri and Thomas H. Lee, "A General Theory of Phase Noise in Electrical Oscillators," IEEE Journal of Solid-State Circuits, Feb. 1998, pp. 179-194, vol. 33, No. 2, IEEE, New York, USA.

Thomas H. Lee and Ali Hajimiri, "Oscillator Phase Noise: A Tutorial," IEEE Journal of Solid-State Circuits, Mar. 2000, pp. 326-336, vol. 35, No. 3, IEEE, New York, USA.

P. Andreani, "Very Low Phase Noise RF Quadrature Oscillator Architecture," Electronics Letters, Jul. 5, 2001, pp. 902-903, vol. 37, No. 14, IEE, United Kingdom.

Lukasdivina and Zbynek Skvor, "The Distributed Oscillator at 4 $GH_z$," IEEE Transactions on Microwave Theory and Techniques, Dec. 1998, pp. 2240-2243, vol. 46, Issue 12, IEEE, New York, USA.

Bendik Kleveland, et al., "Monolithic CMOS Distributed Amplifier and Oscillator," 1999 IEEE International Solid-State Circuits Conference, Feb. 1999, pp. 70-71, IEEE, New York, USA.

Hui Wu and Ali Hajimiri, "Silicon-Based Distributed Voltage-Controlled Oscillators," 2001 IEEE Journal of Solid-State Circuits, Mar. 2001, pp. 493-502, vol. 36, No. 3, IEEE, New York, USA.

Lukas Divina and Zbynek Skvor, "Experimental Verification of a Distributed Amplifier Oscillator," Oct. 1995, pp. 1163-1167, European Microwave Conference, Bologna, Italy, Microwave Exhibitions & Publ. Ltd, United Kingdom.

R. Aparicio and Ali Hajimiri, "Circular-Geometry Oscillators," Proceedings of the 2004 IEEE International Solid-State Circuits Conference, Feb. 2004, vol. 1, IEEE, New York, USA.

Xiang Guan, et al., "Multiple Phase Generation and Distribution for a Fully-Integrated 24-$GH_z$ Phased-Array Receiver in Silicon," Digest of Papers of the 2004 Radio Frequency Integrated Circuits (RFIC) Symposium, Jun. 2004, pp. 229-232, IEEE, New York, USA.

Jri Lee and Behzad Razavi, "A 40-Gb/s Clock and Data Recovery Circuit in 0.18μm CMOS Technology," IEEE Journal of Solid-State Circuits, Dec. 2003, pp. 2181-2190, vol. 38, No. 12, IEEE, New York, USA.

Sander L.J. Gierkink, et al., "A Low-Phase-Noise 5$GH_z$ Quadrature CMOS VCO Using Common-Mode Inductive Coupling," ESSCIRC 2002, 2002, pp. 539-542, ESSCIRC, Europe.

Ahmadreza Rofougaran, et al., "SP 24.6: A900$MH_z$ CMOS LC-Oscillator with Quadrature Outputs," IEEE International Solid-State Circuits Conference, Digest of Technical Papers, Feb. 10, 1996, pp. 392-393, IEEE, New York, USA.

* cited by examiner

ELECTRONIC OSCILLATORS HAVING A PLURALITY OF PHASED OUTPUTS AND SUCH OSCILLATORS WITH PHASE-SETTING AND PHASE-REVERSAL CAPABILITY

FIELD OF THE INVENTION

The present invention relates to electronic oscillators, and more particularly to electronic oscillators having a plurality of phased outputs in which the phase direction can be reversed during operation.

BACKGROUND OF THE INVENTION

An electronic oscillator provides an output signal which varies between two states in a periodic manner (e.g., an oscillation). The two states typically comprise two voltage levels, but may comprise two current levels. Some electric oscillators are constructed to provide two or more outputs. Each output varies between the two states in the same periodic manner, but there is usually a phase difference in their variations. For example, one output may be 90-degrees farther ahead in the periodic variation than another output. Such oscillators are often called multiphased oscillators, polyphase oscillators, or oscillators with multiple-phase outputs.

Many electronic oscillators also include circuitry that allows the frequency of the oscillation to be varied. These are typically called voltage-controlled oscillators (VCOs), in that an input voltage is used to set the value of the oscillation frequency. It is noted that the terminology "voltage-controlled oscillator" is also applied to those electronic oscillators in which an input current, rather than an input voltage, is used to set the oscillation frequency.

SUMMARY OF THE INVENTION

As part of making their inventions, the inventors have recognized that the feedback configurations and termination resistances used in conventional oscillators cause several problems, including noise effects and undesirable power dissipation. A first set of inventions of the present application address these problems. Broadly stated, these inventions encompass a multiphase electronic oscillator that comprises a first plurality of delay stages and a plurality of negative-resistance elements. The delay stages are serially coupled to one another in a loop by a first plurality of nodes. The loop is folded to provide two concentric rings (an inner ring and an outer ring) of delay stages with an equal number of nodes allocated to each ring, with there being a cross-over point between the inner and outer rings. Each negative-resistance element has a first output coupled to a node on the inner ring and a second output coupled to a node on the outer ring. Each output of each negative-resistance element switches between a first voltage level and a second voltage level, and provides a negative resistance to a signal coupled to it (the output) during at least a portion of the transition between voltage levels. When the outputs of a negative-resistance element switch between voltage levels, they switch to opposite voltage levels and switch at substantially the same time. The number of negative-resistance elements may be equal to or less than half the number of nodes.

With the above configuration in oscillation operation, a first pulse having a first voltage level propagates around the loop of delay stages, with a second pulse having a second voltage level propagating behind it, with the first voltage level being higher than the second voltage level. For simplicity, we will call the first pulse the high-voltage pulse (high-voltage level) and the second pulse the low-voltage pulse (low-voltage level). As each pulse reaches a node, it encounters the node in the opposite voltage level, and acts to change the voltage level of the node to its voltage level. In this process, the output of the negative resistance element coupled to the node initially opposes (or may initially oppose) the efforts of the pulse to change the voltage level of the node, but once the pulse has partially changed the voltage level of the node to a certain extent (e.g., the 50% point), the output of the negative resistance element acts to help the pulse change the voltage level of the node by providing negative resistance. With the folded loop configuration, the leading edge of the first pulse propagates on one concentric ring while the leading edge of the second pulse propagates on the other concentric ring, with each leading edge reaching a negative-resistance element at substantially the same time.

As a further part of making their inventions, the inventors have recognized that multiphase electronic oscillators operate with their output phases progressing in one direction (e.g., counter-clockwise), and have further discovered that it would be advantageous in some applications to have an electronic oscillator that could change its direction of oscillation (e.g., from counter-clockwise to clockwise) during operation. For example, the first oscillator output would be 90-degrees ahead of the second oscillator output when the oscillator operates in the first direction, and the first oscillator output would be 90-degrees behind the second oscillator output when the oscillator operates in the second direction.

Accordingly, a second inventions of the present application further comprise a control chain of a second plurality of delay stages and a plurality of control circuits. The second plurality of delay stages are serially-coupled to one another by a second plurality of nodes, and the control chain has a first terminal end and a second terminal end. Each control circuit has an input coupled to a node of the control chain. Each control circuit is coupled to at least a node of the loop or a negative-resistance element, and causes the resistance seen at a node of the loop to be modified in relation to a signal at its input, as received from the control chain. Thus, the oscillator may be halted by placing a first signal on the control chain, and set to oscillate in either direction by thereafter coupling a second signal to either of the two terminal ends of the control chain, one terminal end for counter-clockwise oscillation, the other terminal end for clockwise oscillation. Additionally, a set of method inventions of the present application are directed to starting the oscillators according to the first set of inventions of the application, the methods comprising deactivating the negative resistances seen at the loop nodes, and thereafter activating the negative resistances seen at the loop nodes in a sequential order.

Accordingly, it is an object of the present inventions to improve the noise characteristics of multiphased electronic oscillators.

It is another object of the present inventions to decrease the power consumption of multiphased electronic oscillators.

It is a further object of at least one of the present inventions to enable the direction of oscillation of multiphased electronic oscillator to be reversed during operation.

It is yet another object of at least one of the present inventions to ensure that a desired direction of oscillation of a multiphased electronic oscillator occurs upon powering up of the oscillator.

These and other objects of the present inventions will become apparent to those skilled in the art from the following detailed description of the invention, the accompanying drawings, and the appended claims.

DETAILED DESCRIPTION OF THE INVENTION

In the following description, numerous specific details are set forth to provide a more thorough description of specific embodiments of the inventions. It is apparent, however, that the inventions may be practiced without all the specific details given below. In other instances, well-known features have not been described in detail so as not to obscure the inventions. It is also noted that some of the figures provide schematic diagrams of circuits with signal lines. By convention, two signal lines that cross one another are not electrically coupled to each other unless there is a connection dot at their intersection.

Figure 1:
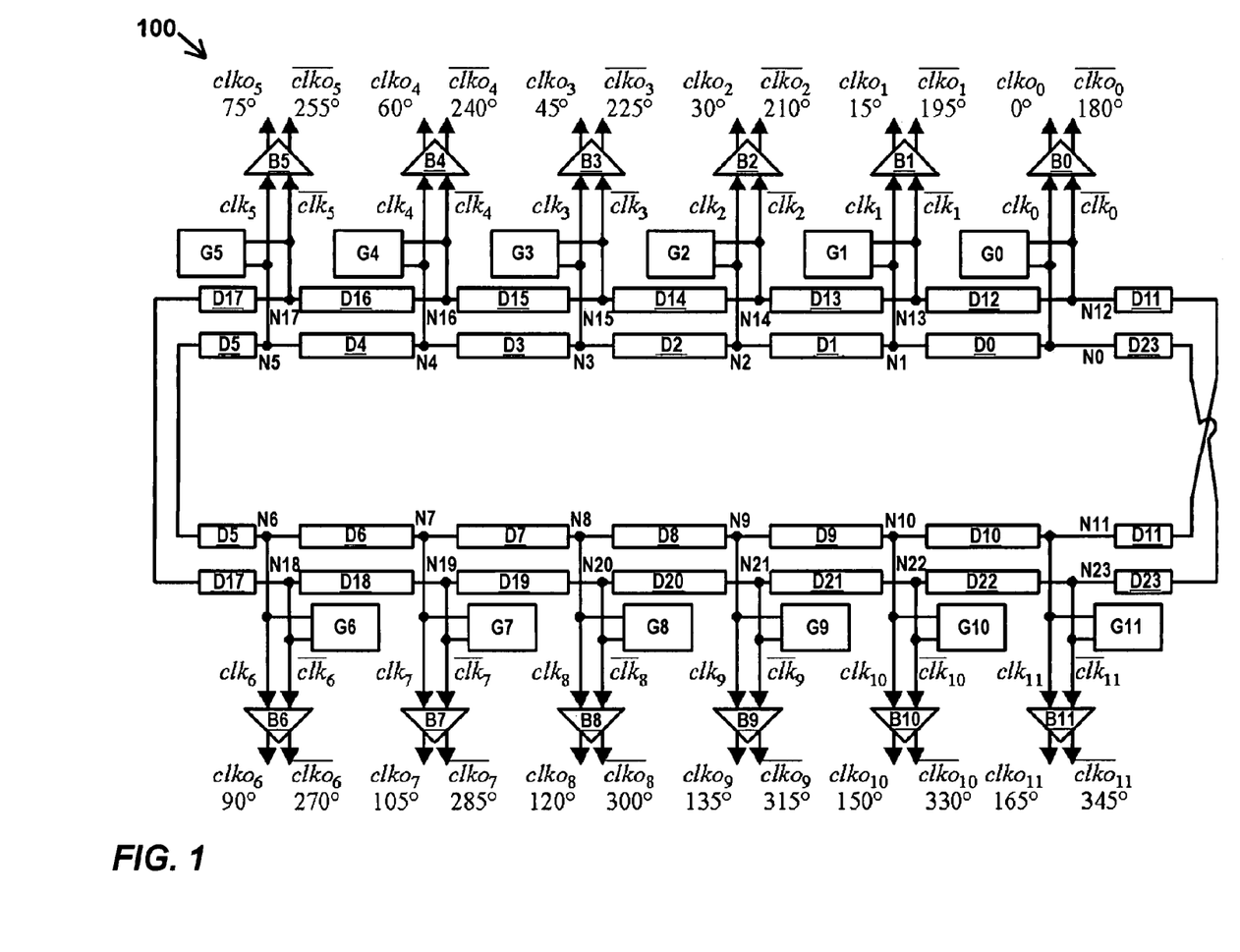
FIG. 1 is a schematic diagram of a first exemplary oscillator according to the present inventions.

FIG. 1 shows a first embodiment 100 of a multiphased electronic oscillator according to the present invention that provides 24 oscillating outputs, which are preferably at 15° phase intervals. Oscillator 100 comprises 24 delay stages D0-D23 serially coupled in a loop by 24 nodes N0-N23, with delay stage D0 (upper right corner of the figure) being coupled between nodes N0 and N1, delay stage D1 being coupled between nodes N1 and N2, etc., with the loop ending by the coupling of delay stage D23 between nodes N23 and N0. The loop is preferably folded to provide two concentric rings of delay stages, with delay stages D0 and D12 being disposed adjacent to each other but on separate concentric rings, with delay stages D1 and D13 being disposed adjacent to each other but on separate concentric rings, and so on. To accomplish the folding of the loop, delay stages D11 and D23 cross one another to effect transitions between the outer concentric ring and the inner concentric ring. As shown in the figure, one-half of delay stage D11 is allocated to the outer ring while the other half is allocated to the inner ring, and one-half of delay stage D23 is allocated to the inner ring while the other half is allocated to the outer ring. (However, it may be appreciated that delay stages D11 and D23 may be wholly allocated to respective concentric rings.) Nodes N0-N11 and delay stages D0-D10 are located on the inner concentric ring, and nodes N12-N23 and delay stages D12-D22 are located on the outer concentric ring. This configuration results in the pair of nodes N0 and N12 being disposed adjacent to each other but on separate concentric rings, the pair of nodes N1 and N13 being disposed adjacent to each other but on separate concentric rings, and so on. Preferably, the nodes in each such pair of nodes are physically located closer to each other than to the other nodes. The advantages of the folded loop with its two concentric rings are described below. The signals at nodes N0 through N11 are designated as signals $clk_0$ through $clk_{11}$, respectively; and the signals at nodes N12 through N23 are designated as signals $\overline{clk_0}$ through $\overline{clk_{11}}$, respectively. The phase difference between the signals at successive nodes is 15°, and the phase difference between each signal pair $clk_i$ and $\overline{clk_i}$, i=1, . . . , 11 is 180°.

Oscillator 100 further comprises twelve (12) negative-resistance elements G0-G11, each having two outputs coupled to a respective pair of adjacent nodes, as shown in the figure. For example, the outputs of negative resistance element G0 are coupled to nodes N0 and N12, the outputs of element G1 are coupled to nodes N1 and N13, and so on. In oscillator operation, a first pulse with a first voltage propagates around the loop of delay stages (counter-clockwise direction), with a second pulse with a second voltage propagating behind it. The first voltage level is higher in value than the second voltage, and is typically between Vdd and 0.5*Vdd, where Vdd is the supply voltage to the oscillator. The second voltage level is typically between 0.5*Vdd and ground potential (e.g., zero). As each pulse reaches a node, it encounters the node with the opposite voltage level, and acts to change the voltage level of the node to its voltage level. In this process, the output of the negative resistance element coupled to the node initially opposes (or may initially oppose) the efforts of the pulse to change the voltage level of the node, but once the pulse has partially changed the voltage level of the node to a certain extent (e.g., the 50% point), the output of the negative resistance element subsequently acts to help the pulse change the voltage level of the node by providing negative resistance (e.g., positive feedback, self-reinforcing amplification).

Negative resistance and positive resistance are well known in the electronics art. A signal coupled to a node sees a positive resistance at that node when the node draws an increasing amount of current from the signal as the signal's voltage increases. On the other hand, a signal coupled to a node sees a negative resistance at that node when the node draws a decreasing amount of current from the signal as the signal's voltage increases. The output of a negative-resistance element G0-G11 may be generated by two cross-coupled inverters, with the input of one inverter and the output of the other inverter provided as one of the element's outputs. Because the cross-coupled inverter configuration is symmetric, it can provide two negative resistance outputs. However, because of the cross-coupling, the two outputs are not independent from one another. When a propagating pulse at one output of the element prompts the output to enter its negative-resistance region, the second output will want to enter its negative-resistance region. Also because of the cross-coupling, the two outputs will want to switch to opposite voltage levels, and to be in opposite voltage levels.

In other words, the first and second voltage levels are opposite steady-state points of the negative-resistance element, and the element has a bias to move its output voltages toward opposite steady-state points, and to switch one of its outputs to the opposite steady-state point when the other output is prompted to switch states by an external signal. Oscillator 100 makes advantageous use of this feature of the cross-coupled inverter construction by coupling the two outputs of each negative-resistance element Gx to two respective nodes on the loop that are separated by an equal number of delay stages (or equal amount of delay), in this case twelve delay stages to each side of each such node. Thus, the phase difference in the oscillation signals at each pair of adjacent nodes (e.g., nodes N0 and N12) will be 180°. Several exemplary embodiments of a negative-resistance element are provided below.

Oscillator 100 will start oscillating upon power-up once sufficient negative resistance is present at the nodes. Upon power-up, there will be mismatches in the voltages at paired nodes, and any small difference will be amplified by the negative-resistance elements. The first and second pulses will develop from the amplified mismatches. However, because the loop is symmetric, the pulses can propagate in either the clockwise direction or counter-clockwise direction. In some applications, the direction of oscillation does not matter, and the controllability of the oscillation direction is not of concern (e.g., when only two phases with 180° phase difference are needed). However, many applications of multiphased oscillators require that the oscillation be in a specific direction. Below, further inventions of the present application enable the oscillation direction to be set, and further enable the direction to be changed (e.g., halted and reversed) after power-up (e.g., during operation).

Oscillator 100 preferably further comprises twelve (12) differential output buffers B0-B11. Each output buffer B0-B11 comprises two differential inputs coupled to respective pairs of adjacent nodes (e.g., nodes N0 and N12 as one pair, nodes N1 and N13 as another, and so on) as shown in the figure, and two differential outputs providing outputs that have a 180° phase difference. Oscillator outputs $clko_i$ and $\overline{clko_i}$ are provided at the outputs of buffers $B_i$, i=1, ... 11. Output $clko_0$ follows the voltage level of signal $clk_0$ at node N0, and is designated as the 0°-phase output, while $\overline{clko_0}$ follows the voltage level of signal $\overline{clk_0}$ at node N12, and is designated as the 180°-phase output, meaning that its signal lags $clko_0$ by 180°. Output $clko_1$ follows the voltage level of signal $clk_1$ at node N1, and is designated as the 15°-phase output, meaning that its signal lags $clko_0$ by 15°. The complementary output $\overline{clko_1}$ follows the voltage level of signal $\overline{clk_1}$ at node N18, and is designated as the 195°-phase output, meaning that its signal lags $clko_0$ by 195°. Each subsequent output lags output $clko_0$ by an additional 15° (15°=360°/24). These phase designations are given for the case of the oscillation direction being counter-clockwise. Thus, it may be appreciated that the delay stages D0-D23 are configured in the folded loop such that two opposite clock phases (i.e., with a 180°-phase difference) are physically close to each other. The number of delay stages sets the number of phases, and generally the phase difference between successive nodes in the loop. For instance, if the loop has 20 delay stages, Oscillator 100 would generate 20 phased outputs with a 18° phase difference between successive outputs. The oscillating frequency is set by the number of delay stages and the delay through the delay stages, i.e., the total delay around the loop. For instance, to achieve a 10 GHz frequency using 24 delay stages, each stage should have a delay of 4.166 ps (=100 ps/24).

Compared to an amplifier-based distributed VCO, oscillator 100 has several advantages. First, oscillator 100 does not require termination resistances, which take up space. Second, feedback is not required because of the loop structure. Third, since termination resistances are not needed, the power dissipation in the termination resistances is eliminated, which reduces overall power dissipation. Fourth, because termination resistances are not used, phase noise is reduced. Fifth, Oscillator 100 is a symmetric structure which produces differential clock phases.

Figure 2:
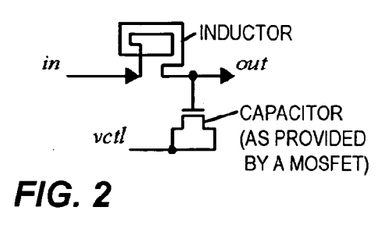
FIGS. 2 and 3 are schematic diagrams of exemplary delay stages that may be used in the oscillator shown in FIG. 1 according to the present inventions.
Figure 3:
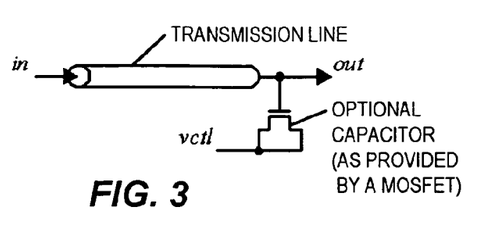

FIGS. 2 and 3 show exemplary embodiments of a delay stage $D_i$, i=0, ..., 23. Each of the delay stages has an input to receive an incoming pulse and an output to convey an outgoing pulse. The delay stage shown in FIG. 2 comprises an inductor coupled between the input and output, and a variable capacitor (as implemented by a MOSFET transistor with its source and drain terminal coupled together as one terminal of the capacitor) coupled between the output and a source of controlled potential vctl. The configuration mimics the behavior of a transmission line, with the amounts of inductance and capacitance setting the delay according to well-known equations. As an option, the capacitance provided by the MOSFET transistor may be varied by varying the value of the control voltage vctl, thereby varying the delay through the stage, and in turn, varying the oscillation frequency of oscillator 100. The capacitance generally decreases in value as the voltage vctl becomes more positive with respect to the average voltage value at the stage's output. The delay stage shown in FIG. 3 comprises a transmission line coupled between the input and output. The delay of the transmission line depends upon its length and its propagation characteristic. As an option, a capacitor may be added to the output of the delay stage to increase the delay through the stage. As a further option, the capacitor may be provided by a MOSFET transistor configured in the same manner as illustrated in FIG. 2 to provide a variable capacitance, and thus a variable amount of delay. Instead of using MOSFET devices to provide variable capacitance in the above two exemplary delay-stage embodiments, other variable capacitor implementations may be used, such as p-n junction varactors, switch-based varactors, etc.

Figure 5:
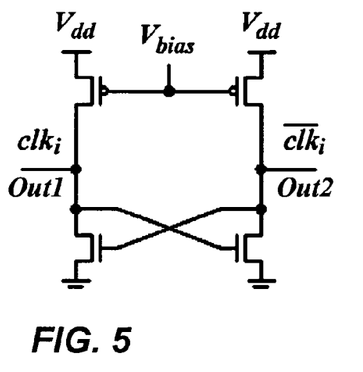
Figure 6:
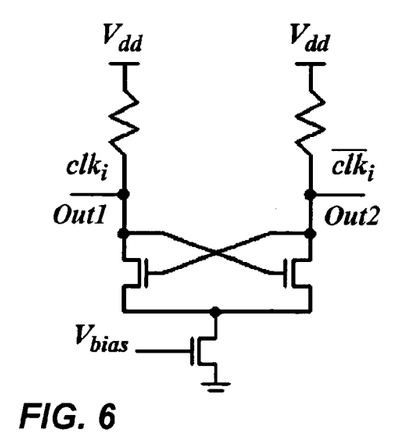
Figure 7:
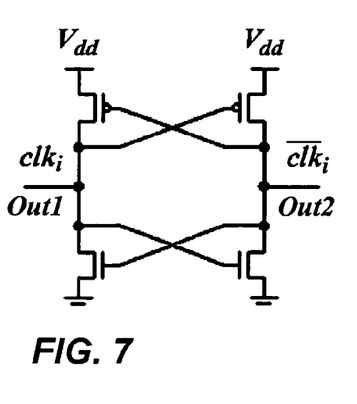

FIGS. 4-7 show respective exemplary embodiments of a negative-resistance element $G_i$, i=0, ..., 11, with the outputs being labeled as Out1 and Out2. Also shown in the figures are the designations of the oscillation signals $clk_i$ and $\overline{clk_i}$ to which the outputs are normally coupled in oscillator 100 (FIG. 1). The negative-resistance element shown in FIG. 4 comprises a cross-coupled pair of CMOS inverters that have the source terminals of their NMOS transistors coupled to ground potential through a common NMOS bias transistor, which moderates the flow of current and controls the amount of negative resistance presented at outputs Out1 and Out2. A control voltage $V_{bias}$ is applied to the gate of the NMOS bias transistor for these purposes. It may be appreciated that the bias transistor is not essential, and can be omitted. This configuration is shown in FIG. 7. It may also be appreciated that a PMOS bias transistor may be used instead, with the PMOS bias transistor coupled between the supply voltage Vdd and each of the source terminals of the other PMOS transistors (in this case, the NMOS bias transistor can be omitted, and the source terminals of the other NMOS transistors coupled to ground). The negative-resistance element shown in FIG. 5 comprises a cross-coupled pair of NMOS inverters that use PMOS transistors as loads. A bias voltage $V_{bias}$ is applied to the gates of the PMOS transistors to control the current flow through the inverters and to control the amount of negative resistance presented at outputs Out1 and Out2. It may be appreciated that the complementary circuit may be used as well. The complementary circuit comprises PMOS inverters that use NMOS transistors as loads, with a bias voltage being applied to the gates of the NMOS transistors. The negative-resistance element shown in FIG. 6 comprises a cross-coupled pair of NMOS inverters that use resistors as loads, and which have the source terminals of their NMOS transistors coupled to ground potential through a common NMOS bias transistor. A bias voltage $V_{bias}$ is applied to the gate of the NMOS bias transistor to control the current flow through the inverters and to control the amount of negative resistance presented at outputs Out1 and Out2. It may be appreciated that the complementary circuit may be used as well. The complementary circuit comprises PMOS inverters that use resistors as loads, and which have the source terminals of their PMOS transistors coupled to the supply voltage Vdd through a common PMOS bias transistor.

Figure 8:
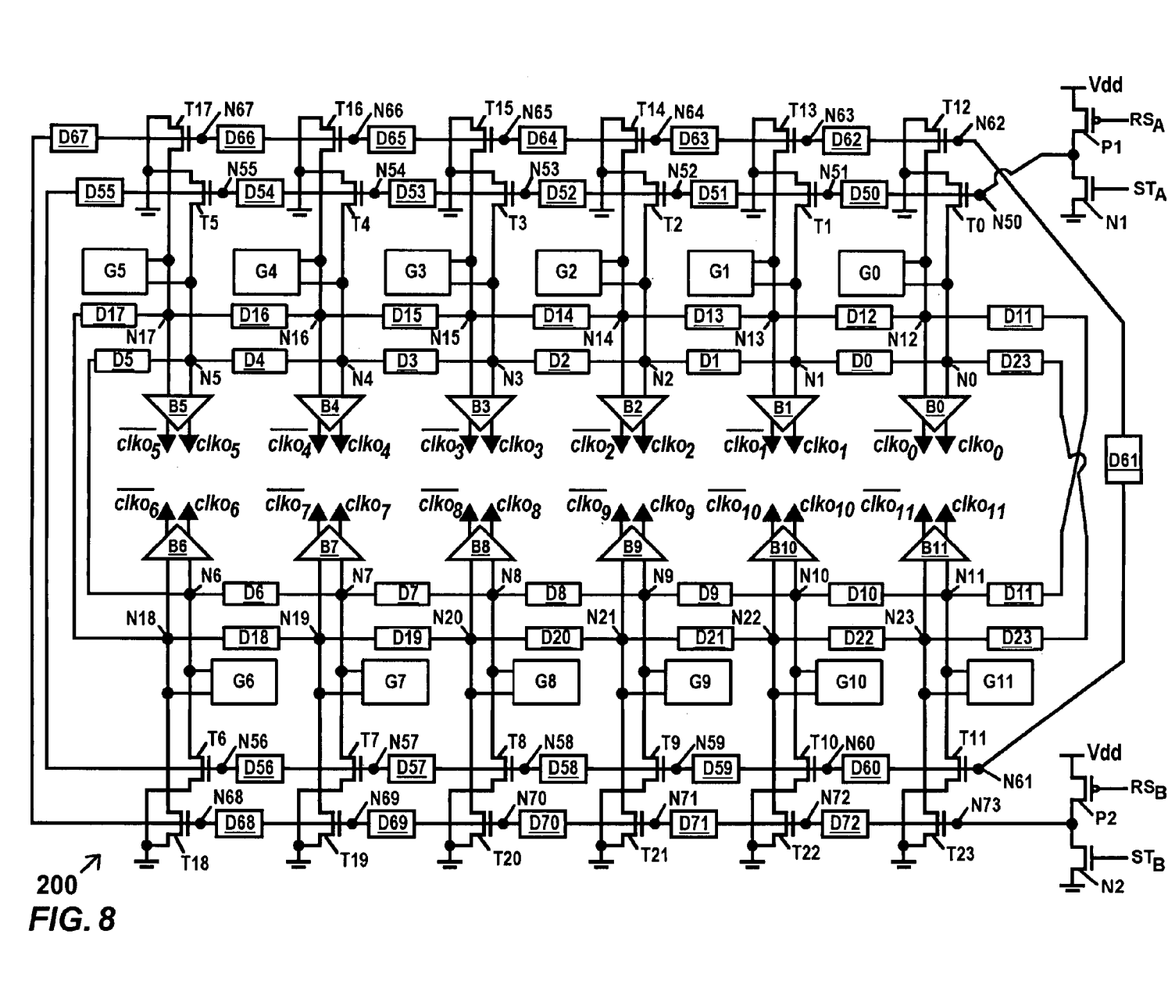
FIG. 8 is a schematic diagram of a second exemplary oscillator according to the present inventions.

FIG. 8 shows a second embodiment 200 of a multiphased electronic oscillator according to the present invention that provides 24 oscillating outputs, which are preferably at 15° phase intervals, and which provides circuitry for initializing the oscillator and setting its oscillation direction in either the clockwise or counter-clockwise direction. Oscillator 200 comprises the delay stages D0-D23, the nodes N0-N23, the negative resistance elements G0-G11, and the output buffers B0-B11 of oscillator 100, with these components being coupled to one another in the same way as in oscillator 100. In addition, oscillator 200 comprises 23 delay stages D50-D72 serially coupled in a chain (known herein after as "control chain") by 24 nodes N50-N73, with delay stage D50 (upper right corner of the figure) being coupled between nodes N50 and N51, delay stage D51 being coupled between nodes N51 and N52, and so on. The control chain is folded once upon itself, and has an inner ring that tracks the inner concentric ring formed by the loop of delay stages D0-D23, and an outer ring that tracks the outer concentric ring formed by the loop of delay stages D0-D23. Oscillator 200 further comprises 24 transistors T0-T23 that are used to selectively introduce positive resistance at each of nodes N0-N23, respectively, with the overall amount of positive resistance, when activated, being sufficient to counteract the negative resistance generated by elements G0-G11. The counteracting positive resistance, when activated, stops the propagation of the high-voltage and low-voltage pulses in the loop of delay stages D0-D23, and thereby stops the oscillation operation of oscillator 200, even when power is provided to the oscillator. To resume oscillation operation, the positive resistance coupled to nodes N0-N23 is deactivated in one of at least two sequential orders; one of these sequential orders, as explained below, sets the oscillation direction in the counter-clockwise direction, while another sequential order sets the oscillation direction in the clockwise direction. The sequential orders are provided by way of the control chain of delay stages D50-D72 and selective excitations at the ends of the control chain, as explained in greater detail below. Each of transistors T0-T23 comprises two conduction terminals through which current may controllably flow (i.e., the amount can be varied), and a modulation terminal which receives a signal that modulates (i.e., controls) the amount of current that flows between the conduction terminals, and further that controls the amount of positive resistance between the conduction terminals. Transistors T0-T23 are readily implemented by NMOS transistors (PMOS transistors will work as well), where the modulation terminal is provided by the NMOS's gate terminal, and the two conduction terminals are provided by the NMOS's source and drain terminals. The gate terminals (i.e., modulation terminals) of control transistors T0-T23 are coupled to nodes N50-N73, respectively. The drain terminals (i.e., first conduction terminals) of control transistors T0-T23 are coupled to nodes N0-N23, respectively. The source terminals (i.e., second conduction terminals) of transistors T0-T23 are coupled to ground potential. (If PMOS transistors were used, the source terminals would be coupled to the supply voltage Vdd.)

To halt the oscillation of oscillator 200, a positive potential, such as the supply voltage Vdd, is applied to the gate terminals of NMOS transistors T0-T23, preferably by way of one or both of nodes N50 and N73. This may be accomplished by selectively coupling each of nodes N50 and N73 to the supply voltage Vdd by way of two PMOS transistors P1 and P2, respectively, as shown in FIG. 8. The coupling of the positive potential causes each of NMOS transistors T0-T23 to enter a conductive state where current may flow between its conduction terminals, and a positive resistance develops between the terminals. This dampens the propagation of the high-voltage pulse by neutralizing the negative resistance and killing the gain of elements G0-G11, which acts to gradually set all of the node voltages to a reset voltage approximately midway between the supply voltage Vdd and ground, but closer to ground (e.g., Vdd/3), and finally stops the oscillation. The source terminals of each of PMOS transistors P1 and P2 are coupled to the supply voltage Vdd, the drain terminals of the transistors are coupled to nodes N50 and N73, respectively, and the gate terminals of the transistors are coupled to reset signals $RS_A$ and $RS_B$, which may be the same signal, but are shown separately for generality. To place PMOS transistors P1 and P2 in conductive states, reset signals $RS_A$ and $RS_B$ are placed in logic-low states (e.g., voltage levels at or near ground potential). Once the gates of transistors T0-T23 are charged up to a value near Vdd, PMOS transistors P1 and P2 may be placed in non-conductive states (by having reset signals $RS_A$ and $RS_B$ enter logic-high states, e.g., voltage near or at the supply voltage Vdd), and oscillator 200 thereafter remains in a non-oscillating state with nodes N0-N23 of the oscillation loop near ground potential until the gate terminals are discharged.

To halt the oscillation, each of transistors T0-T23 can provide a magnitude of positive resistance that is equal to or greater than the magnitude of the maximum negative resistance generated at the output of the negative resistance element to which it is coupled. Also, each of transistors T0-T23 can be sized and gate-driven so as to substantially clamp the output of the element to which it is coupled to a given potential, thereby disabling the operation of the negative-resistance element. In either case, the transistors act to halt the oscillation by disabling (neutralizing) the negative resistance presented to the loop nodes by the negative-resistance element G0-G11.

By next discharging the control chain of delay stages D50-D72 starting at node N50, oscillator 200 may be set to oscillate in the counter-clockwise direction. When node N50 is discharged, transistor T0 is the first transistor in the control chain to enter a non-conducting state. This allows the voltage at node N0 to rise in value because of the current provided to the node by one of the loads in the pair of cross-coupled inverters of element G0, see FIGS. 4-7. The raised voltage at node N0 will then propagate as a raised-voltage wave to both of nodes N1 and N23. At the same time, a discharge wave propagates around the control chain of delay stages D50-D72. As the propagation of the raised-voltage wave reaches node N2, the discharge wave propagating through delay stages D50-D72 sets transistor T1 in a non-conductive state, and allows the voltage of node N1 to rise in value because of current provided to the node by one of the loads of element G1. This action reinforces the raised-voltage wave propagating from node N0. On the other hand, node N23 remains near the reset voltage (e.g., Vdd/3) since the discharge wave in delay stages D50-D72 has not yet reached transistor T23. This effectively stops the raised-voltage wave from propagating in the clockwise direction. Next in the sequence, the discharge wave propagating through delay stages D50-D73 reaches transistor T2, setting it in a non-conductive state, and the raised-voltage wave from node N1 reaches node N2. Both of these actions raise the voltage at node N2 and continue the propagation of the raised-voltage wave in a counter-clockwise direction toward node N3. These actions continue around the loop, with the value of the raised-voltage wave gradually increasing as it propagates. The reset voltage on node N23 exerts a pull-down effect on the voltage of node N0, keeping it from reaching the highest value it obtains during steady-state oscillation operation. The pull-down effect of node N23 is less on node N1, and still less on node N2, and so on, because of the actions of elements G1 and G2, and so on, thus allowing the raised-voltage wave to increase in value as it propagates.

When the raised-voltage wave crosses from the inner concentric ring to the outer concentric ring to reach node N12, and when the discharge wave reaches node N62, both waves act to raise the voltage level of node N12. In response thereto, negative-conductance element G0 acts to lower the previously-raised voltage at node N0. In this regard, element G0 receives assistance from the relatively-low reset voltage on node N23, which remains at that voltage because transistor T23 remains in a conductive state (since the discharge wave has not yet reached node N73). These actions continue the propagation of the raised-voltage wave in a counter-clockwise direction around the outer concentric ring of delay stages D0-D23, and starts the propagation of a lowered-voltage wave in the inner concentric ring, starting at node N0. The reset voltage at node N23 now has an assisting effect in reinforcing the propagation of the lowered-voltage wave because of its relatively low value. Next, the lowered-voltage wave propagates to node N1 on the inner concentric ring, the raised-voltage wave propagates to node N13 on the outer concentric ring, and the discharge wave propagates to node N63. In response thereto, negative-conductance element G1 acts to lower the previously-raised voltage at node N1, and to raise the voltage at node N13. Both voltage waves continue to propagate around the concentric rings in a counter-clockwise direction, growing gradually in amplitude as they propagate. Approximately by the time the voltage waves reach nodes N11 and N23, the discharge wave has reached node N73, and the last control transistor in the control chain, transistor T73, is placed in a non-conducting state, and all of the negative-resistance elements are allowed to operate unconstrained. Next, the raised-voltage wave reaches node N0, and the lowered-voltage wave reaches node N12, at which time the raised-voltage wave has propagated around the loop of delay stages D0-D23 one time, and the lowered-voltage wave has propagated through one-half of the loop. Both waves continue to propagate in a counter-clockwise direction, each wave growing in magnitude as it propagates until its magnitude reaches its steady-state value, at which time the waves may be called the high-voltage pulse and the low-voltage pulse, respectively.

The above sequence of events was initiated by placing node N50 at a low-voltage level, which in turn started the discharge wave along the control chain of delay stages D50-D72 in the counter-clockwise direction. Placing node N50 at a low-voltage level can be accomplished by selectively coupling node N50 to the ground potential by way of an NMOS transistor N1, as shown in FIG. 8. The drain terminal of transistor N1 is coupled to node N50, the source terminal is coupled to ground potential, and the gate terminal is coupled to a start signal $ST_A$. To start the oscillation in the counter-clockwise direction after oscillator 200 has been reset (e.g., after reset signals $RS_A$ and $RS_B$ have been set to logic-low levels for a period of time and then placed at logic-high levels), start signal $ST_A$ is placed at a logic-high level, which turns on transistor N1, which in turn discharges node N50 and starts the discharge wave.

To set oscillator 200 oscillating in the clockwise direction after it has been reset, the control chain of delay stages D50-D72 is discharged starting at node N73, rather than node N50. Because the circuitry of oscillator 200 is symmetrical, the raised-voltage wave and lowered-voltage wave will develop in the loop of delay stages D0-D23 as before, but will start out at nodes N23 and N11, respectively, and will propagate in the clockwise direction. Similar actions as described above occur for this case, and a detailed description thereof is not necessary since the circuitry is symmetrical. Placing node N73 at a low-voltage level can be accomplished by selectively coupling node N73 to the ground potential by way of an NMOS transistor N2, as shown in FIG. 8. The drain terminal of transistor N2 is coupled to node N73, the source terminal is coupled to ground potential, and the gate terminal is coupled to a second start signal $ST_B$. To start the oscillation in the clockwise direction after oscillator 200 has been reset (e.g., after reset signals $RS_A$ and $RS_B$ have been set to logic-low levels for a period of time and then placed in logic-high levels), start signal $ST_B$ is placed at a logic-high level, which turns on transistor N2, which in turn discharges node N73 and starts the discharge wave propagating in the clockwise direction around the control chain of delay stages D50-D72. Thus, to use oscillator 200, a user can first issue reset signals $RS_A$ and $RS_B$ (which may be the same signal) to place oscillator 200 in a reset state, and then issue start signal $ST_A$ to set oscillator 200 running in the counter-clockwise direction, or issue start signal $ST_B$ to set oscillator 200 running in the clockwise direction.

In the case that PMOS transistors are used for control transistors T0-T23, the gates of the transistors are discharged to place the oscillator in a reset state, and the voltages at nodes N0-N23 go to a reset voltage that is closer to Vdd than ground potential (e.g., 2/3*Vdd). Oscillation is then started in the counter-clockwise direction by charging (rather than discharging) the control chain of delay stages D50-D72 at node N50, or in the clockwise direction by charging the control chain at node N50. Instead of a discharge wave, a charging wave propagates in the control chain. Thus, to be more general, the charging wave and the discharging wave are more generally known as the control waves as they control the conduction states of control transistors T0-T23. Also in the case that PMOS transistors are used for control transistors T0-T23, the transistors N1, N2, P1, and P2 are configured in the complementary circuit configuration (e.g., transistor N1 assumes the function of transistor P1 and is controlled by the complement of reset signal $RS_A$, transistor P1 assumes the function of transistor N1 and is controlled by the complement of start signal $ST_A$, and so on).

While two reset transistors P1 and P2 have been shown, it may be appreciated that only one of these reset transistors may be used. However, the reset operation will take longer.

It is also possible to achieve substantially the same reset time provided by transistors P1 and P2 with only one reset transistor by coupling the drain of the single reset transistor to a node in the middle of the control chain of delay stages D50-D72, such as node N61 or N62, and by sizing the device with twice the channel width. In addition, while reset transistors P1 and P2 have been shown coupled to nodes N50 and N73, it may be appreciated that they may be coupled to any of the other nodes N51-N72.

While MOSFET transistors have been used to illustrate transistors T0-T23, N1, N2, P1, and P2, it may be appreciated that each of these components may be implemented by other transistors, such as bipolar transistors, insulated-gate field-effect transistors, junction field-effect transistors (JFETs), heterojunction bipolar transistors, HEMTS, etc. In general, each of these components may be implemented by any switch device in any semiconductor technology (e.g., Si, SiGe, GaAs, etc.), and are broadly identified herein as variable-conductance elements and switches.

While oscillator 200 enables a user to set the oscillation direction, it may be appreciated that a user may only need to reliably set the oscillation in one direction for a given application. Oscillator 200 can meet this need as well. For example, if only the counter-clockwise direction is needed, transistor N2 can be omitted, the gates of transistors N1, P1, and P2 can be coupled to a common control signal that has a logic-low state to place oscillator 200 in a reset state, and a logic-high state to set oscillator 200 running in the counter-clockwise direction. In addition, if a slower reset operation can be tolerated, transistor P2 can be omitted. Similarly, if only the clockwise direction is needed, transistor N1 can be omitted, and the gates of transistors N2, P1, and P2 can be coupled to a common control signal that has a logic-low state to place oscillator 200 in a reset state, and a logic-high state to set oscillator 200 running in the clockwise direction. In addition, if slower a reset operation can be tolerated, transistor P1 can be omitted.

Figure 9:
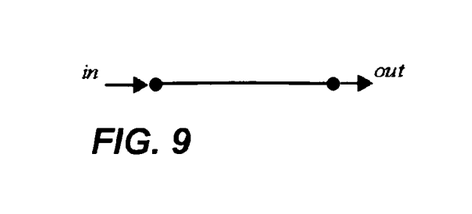
FIGS. 9 and 10 show exemplary embodiments for the delay stages of the start circuitry (control chain) according to the present inventions.
Figure 10:
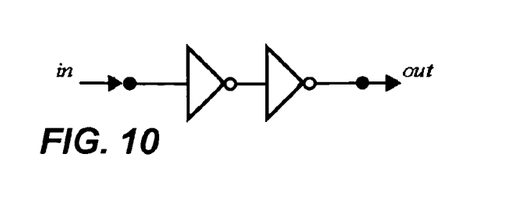

While each delay stage D50-D72 may be implemented by the delay stages shown in FIGS. 2 and 3, these implementations are currently not preferred because of their relatively large size. Instead, we prefer to use the embodiments of an RLC wire shown in FIG. 9 or a pair of serially-coupled inverters shown in FIG. 10 to implement each of delay stages D50-D72. The RLC wire is a standard interconnect wire whose dimensions are selected according to prior art teachings to provide a given amount of resistance, inductance, and capacitance that, when combined with the gate capacitance of a control transistor T0-T23, provides a desired amount of delay. Ideally, the delay through each delay stage D50-D72 should substantially match the corresponding delay through delay stages D0-D22. However, circuit simulations indicate that oscillator 200 starts successfully for a wide range of delay values of delay stages D50-D72, thus facilitating the use of the embodiments shown in FIGS. 9 and 10. Moreover, wire delay may not need to be explicitly set, and any arbitrary-sized wire may be sufficient for starting oscillator 200. In any event, it is well within the ability of one of ordinary skill in the art to simulate a specific implementation of oscillator 200 with selected delay values for stages D50-D72 (e.g., as provided by selected wire sizes) with a SPICE-based simulation program to confirm operation.

While the same phase-difference between successive stages has been shown in the above embodiments, it may be appreciated that different phase differences may be used by varying the time delays through the delay stages. For instance, the stages between $clko_0/\overline{clko}_0$ and $clko_1/\overline{clko}_1$ can be designed to produce a 20° phase difference, whereas the stages between $clko_1/\overline{clko}_1$ and $clko_2/\overline{clko}_2$ can be designed to produce a 25° phase difference. Dynamically, a VCO can be constructed by inserting circuitry to vary the segment delay, such as a varactor at each node. In this case, the delay of each segment can be varied either independently from the other segments or in coordination with the delay of the other segments.

Figure 11:
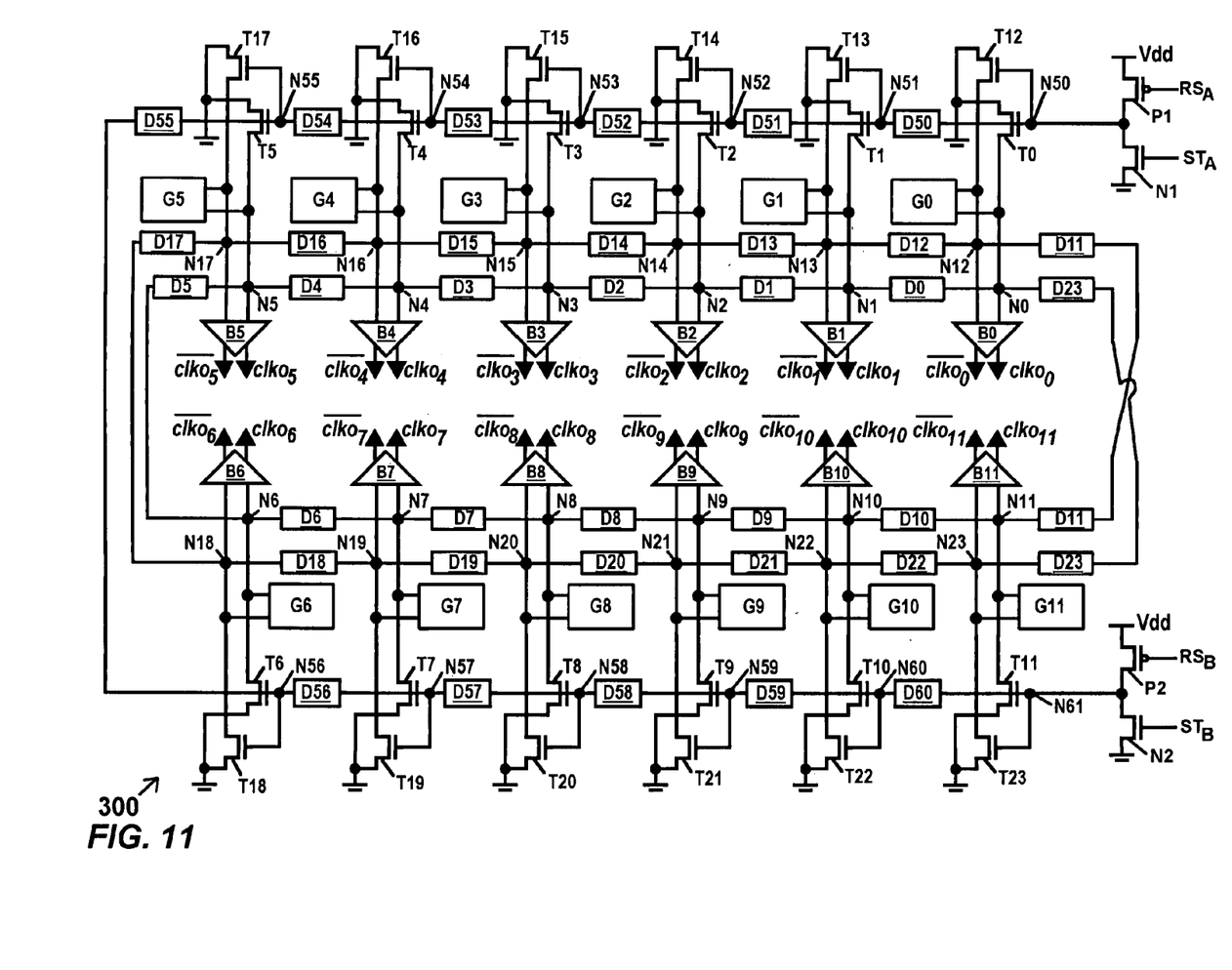
FIG. 11 is a schematic diagram of a third exemplary oscillator according to the present inventions.

FIG. 11 shows a third embodiment of an oscillator according to the present invention at 300. Oscillator 300 comprises the same components as oscillator 200, except for the omission of delay stages D61-D72 and nodes N62-N73. The components of oscillator 300 are configured the same way as the corresponding components of oscillator 200 except that the output of the circuit formed by transistors N2 and P2 is coupled to node N61 instead of node N73, and except that the modulation terminals of control transistors T12-T23 are coupled to nodes N50-N61, respectively, instead of nodes N62-N73, respectively. As such, the control chain of delay stages only forms one ring around the delay loop, and the same control signal at a control node (N50-N61) controls both pairs of control transistors associated with each negative-resistance element G0-G11. After being placed in the reset state, oscillator 300 is set to one of the two oscillation directions by activating either of signals $ST_A$ or $ST_B$, as described above with respect to oscillator 200. When, for example, signal $ST_A$ is activated, a discharge wave will propagate through delay stages D50-D61, as before. Also, a raised-voltage wave will develop at either of nodes N0 and N12 and a lowered-voltage wave will develop at the other of these nodes. The development will depend upon manufacturing differences in the circuits coupled to these nodes, any initial imbalances in the voltages at these nodes, and noise signals present within the circuit. Nonetheless, negative-resistance element G0 will act to force a raised-voltage wave at one of the nodes N0 and N12 and a lowered-voltage wave at the other, and the specific location does not matter. The propagation of the raised-voltage wave then progresses towards one of nodes N1 and N13 as before. However, as a difference with the start-up of oscillator 200, the lowered-voltage wave also progresses towards the other of nodes N1 and N13. The raised-voltage wave and lowered voltage wave also propagate in the clockwise direction toward nodes N11 and N23. However, further clockwise progression is stopped by the fact that transistors T11 and T23 are still in conducting states, as set by the previous reset operation. Thus, the voltage waves can only propagate in the counter-clockwise direction (after being initiated by signal $ST_A$). They grow in value as they propagate, and oscillator 300 progresses toward full oscillation operation when the discharge wave reaches node N61.

Figure 12:
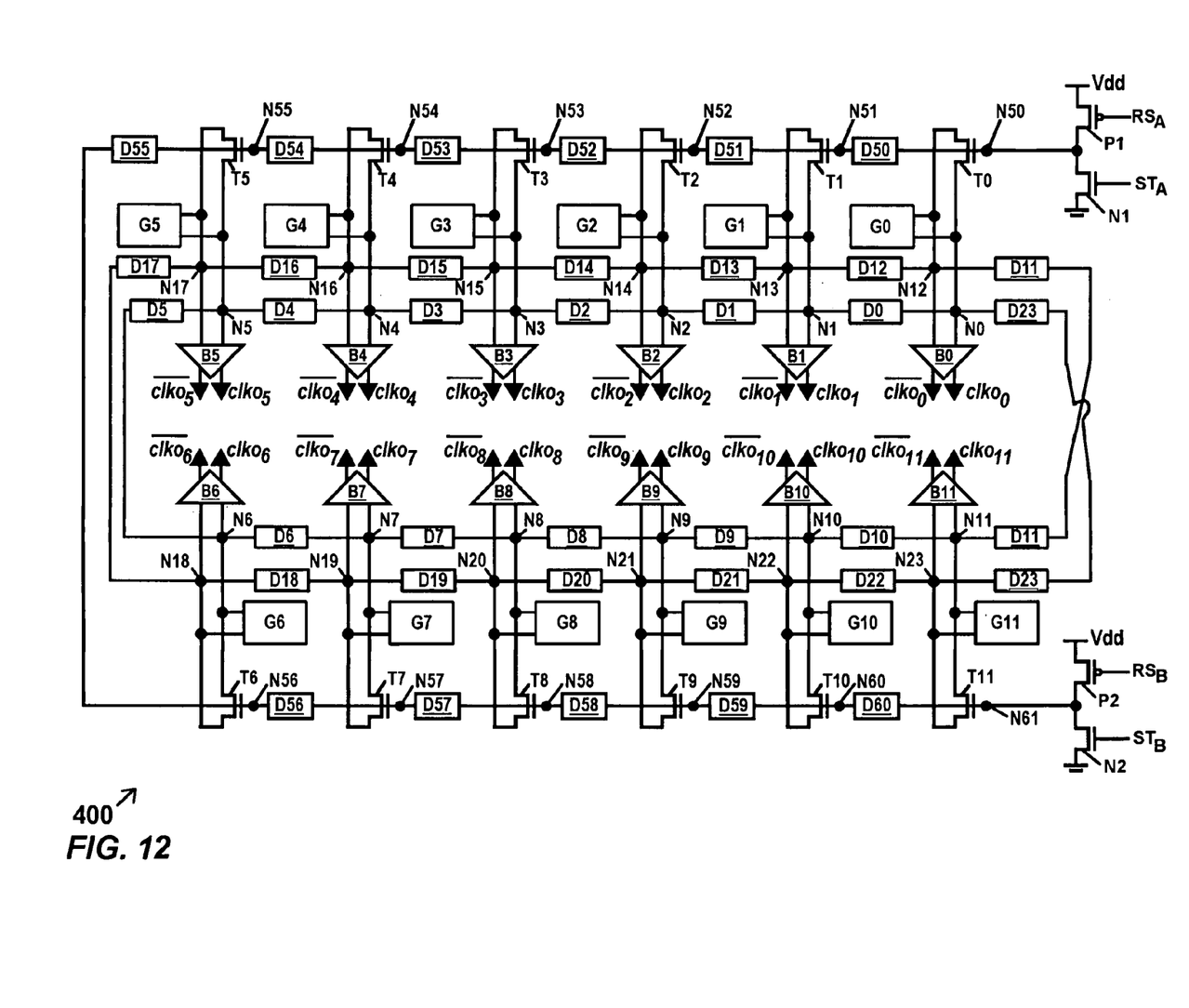
FIG. 12 is a schematic diagram of a fourth exemplary oscillator according to the present inventions.
Figure 13:
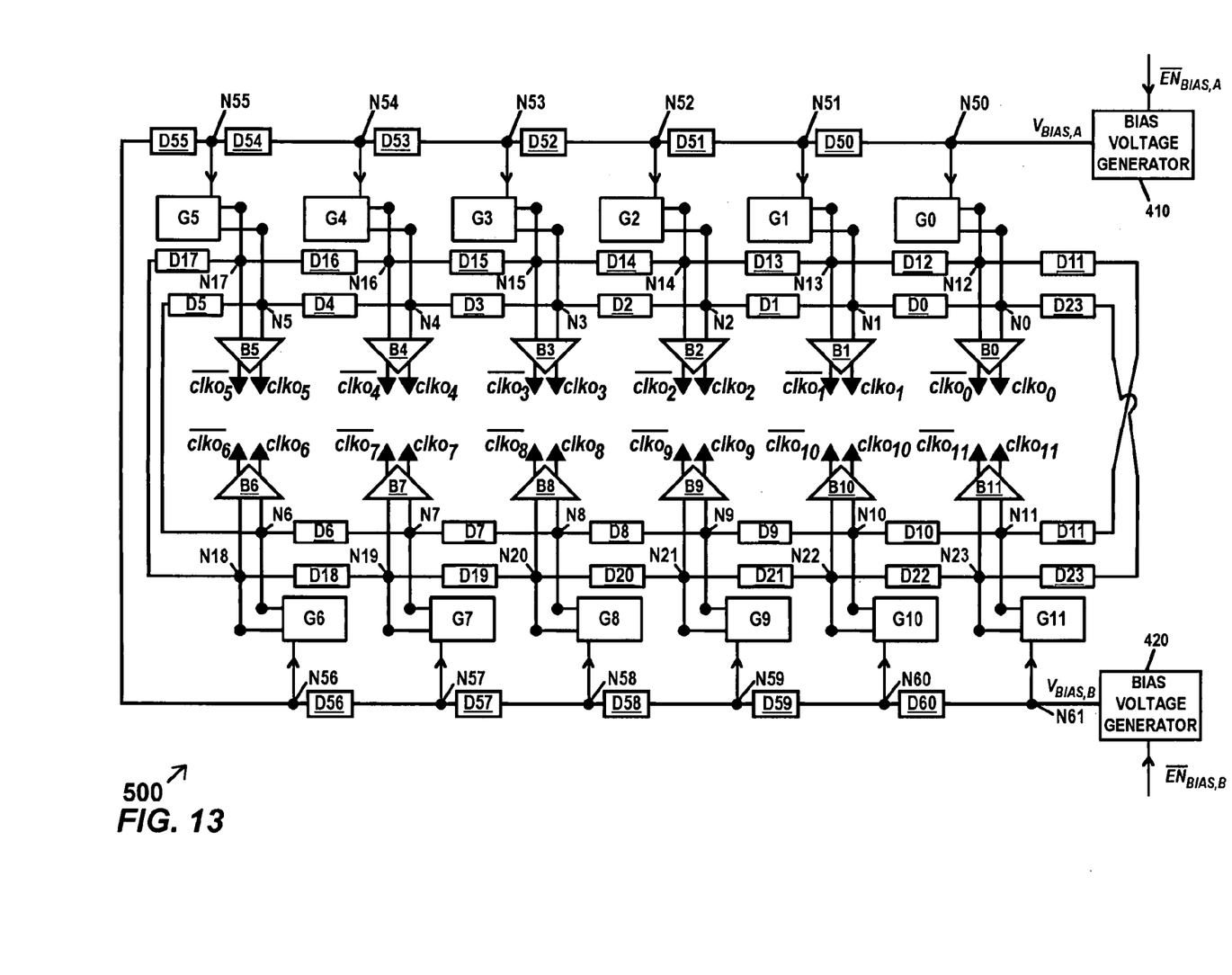
FIG. 13 is a schematic diagram of a fifth exemplary oscillator according to the present inventions.

FIG. 12 shows a fourth embodiment of an oscillator according to the present invention at 400. Oscillator 400 comprises the same components as oscillator 300, except for control transistors T12-T23, which are not used. The components of oscillator 400 are configured the same way as the corresponding components of oscillator 300 except that the first and second conduction terminals of each control transistor T0-T11 are coupled to the first and second outputs, respectively, of a respective negative-resistance element G0-G11, as shown in the figure. Oscillator 400 is reset and thereafter set to oscillate in one of two oscillation directions by the same sequence of steps described above for oscillators 200 and 300. Under reset conditions, each of transistors T0-T11 is conductive, and couples the adjacent nodes of the loop (e.g., adjacent nodes N0 and N12, and so on) together, and sets (clamps) their voltages to substantially the same value. In addition, this presents a positive resistance to both outputs of each negative-resistance element that counteracts the negative resistances at the element's outputs. To start the oscillation, the control transistors T0-T11 are sequentially placed in their non-conductive states, thereby allowing a raised-voltage wave and a lowered-voltage wave to develop at an adjacent pair of loop nodes (e.g., adjacent nodes N0 and N12, or adjacent nodes N11 and N23), and to propagate around the loop in a desired direction, and grow in amplitude, as described above.

FIG. 12 shows a fourth embodiment of an oscillator according to the present invention at 500. Oscillator 500 comprises the same components as oscillator 300, with the exception that control transistors T1-T11, which are not used, and with the exception that each of negative-resistance elements G0-G11 comprises an input to receive a signal that controls the value of the resistance provided at its first and second outputs. The exemplary embodiments for elements G0-G11 shown in FIGS. 4-6 have such an input provided at the $V_{bias}$ line. That is to say, the input signal provided at the $V_{bias}$ lines in each of these exemplary circuits changes the biasing of the cross-coupled inverters of the negative-resistance element, and, as such, the signal $V_{bias}$ is capable of changing the resistance provided at each output from a negative value (when $V_{bias}$ is set to cause currents to flow in one or both of the cross-coupled inverters), to a non-negative value of zero (when $V_{bias}$ is set to stop current flows in the cross-coupled inverters). Oscillator 500 further comprises a plurality of electrical connections between nodes N50-N61 and negative-resistance elements G0-G11, respectively, and further comprises a first bias voltage generator 410 and a second bias voltage generator 420. Generator 410 comprises an output for selectively providing a bias signal $V_{BIAS,A}$ and an input to receive an enable signal $\overline{EN}_{BIAS,A}$ (which is active low) that has a first state (e.g., logic-low level) that causes generator 410 to generate bias signal $V_{BIAS,A}$ at its output, and a second state that causes generator 410 to cease generating bias signal $V_{BIAS,A}$ at its output. The output of generator 410 is coupled to node N50 of the loop of delay stages. Similarly, Generator 420 comprises an output for selectively providing a bias signal $V_{BIAS,B}$ and an input to receive an enable signal $\overline{EN}_{BIAS,B}$ (which is active low) that has a first state (e.g., logic-low level) that causes generator 420 to generate bias signal $V_{BIAS,B}$ at its output, and a second state that causes generator 420 to cease generating bias signal $V_{BIAS,B}$ at its output. The output of generator 420 is coupled to node N61 of the loop of delay stages.

Figure 4:
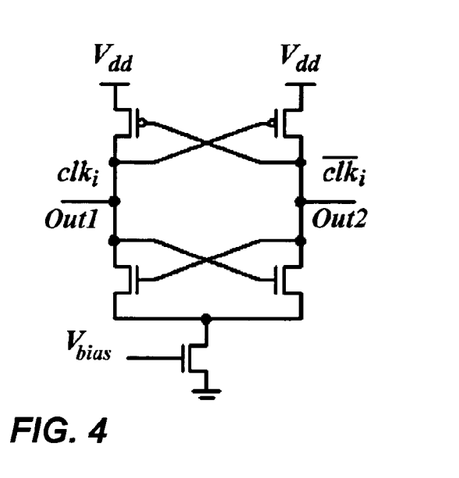
FIGS. 4-7 are schematics of exemplary negative-resistance elements that may be used in the oscillator shown in FIG. 1 according to the present inventions.
Figure 14:
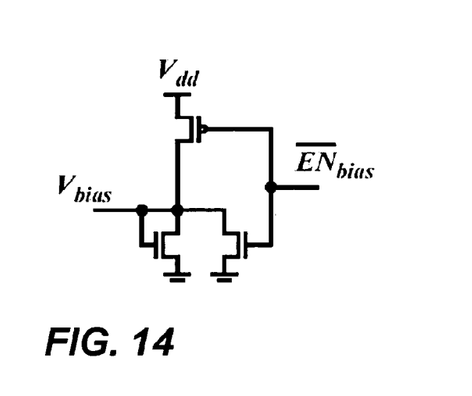
FIG. 14 is a schematic diagram of an exemplary bias voltage generator for the fifth exemplary oscillator shown in FIG. 13 according to the present inventions.

An exemplary embodiment for each of bias voltage generators 410 and 420 is shown in FIG. 14, which is suitable for use with the negative-resistance elements shown in FIGS. 4 and 6. It comprises a PMOS transistor and an NMOS transistor (the leftmost NMOS transistor) configured in a current-mirror topology to provide a mirror voltage at the $V_{BIAS}$ line when the input $\overline{EN}_{BIAS}$ is in a logic-low state, and further comprises an NMOS shunt transistor (the rightmost NMOS transistor) that is configured to shunt the $V_{BIAS}$ line to ground potential when the input $\overline{EN}_{BIAS}$ is in a logic-high state. If the complementary circuits to the embodiments shown in FIGS. 4 and 6 are used, or if the negative-resistance element shown in FIG. 5 is used, then one may use the complementary circuit to that shown in FIG. 14 for generators 410 and 420.

To place oscillator 500 in a reset state, both of enable signals $\overline{EN}_{BIAS,A}$ and $\overline{EN}_{BIAS,B}$ are placed in logic-high states, which shunts the $V_{BIAS}$ signals in all of the negative-resistance elements, and causes each of the elements G0-G11 to have zero or positive resistance at their outputs. For example, if the embodiment shown in FIG. 6 is used for elements G0-G11, the resistances provided by the load resistors will provide positive resistance at outputs Out1 and Out2; and if the embodiments shown in FIGS. 4 and 5 are used, zero resistance or positive resistance will be provided at one output depending upon the voltage at the other output.

To place oscillator 500 in an oscillating state with counter-clockwise oscillation, enable signal $\overline{EN}_{BIAS,A}$ is placed in a logic-low state, while enable signal $\overline{EN}_{BIAS,B}$ is maintained in a logic-high state for at least a period of time sufficient for the raised-voltage wave and the lowered-voltage wave to propagate around one concentric ring of the loop. To place oscillator 500 in an oscillating state with clockwise oscillation, enable signal $\overline{EN}_{BIAS,B}$ is placed in a logic-low state, while enable signal $\overline{EN}_{BIAS,A}$ is maintained in a logic-high state for at least a period of time sufficient for the raised-voltage wave and the lowered-voltage wave to propagate around one concentric ring of the loop. This sequencing of enable signals starts a wave of bias voltage propagating in the control chain of delay stages D50-D61, starting at either node N50 or N61, which in turn causes negative-resistance elements G0-G11 to provide negative resistance at their outputs in one of two sequential orders. The sequential activation of the negative-resistance elements G0-G11 allows a raised-voltage wave and a lowered-voltage wave to develop at an adjacent pair of loop nodes (e.g., adjacent nodes N0 and N12, or adjacent nodes N11 and N23), and to propagate around the loop in a desired direction, and grow in amplitude, as described above.

From the above description of the oscillator embodiments, it may be appreciated that the control transistors T0-T23 of oscillator 200 comprise twelve respective control circuits, each of which has two inputs coupled to two respective nodes of the control chain and two outputs coupled to the outputs of a respective element G0-G11, and further coupled to the loop nodes connected thereto, with each control circuit causing the resistance seen at the two loop nodes to be modified in relation to the signals at its inputs. It may also be appreciated that the control transistors T0-T23 of oscillator 300 comprise twelve respective control circuits, each of which has an input coupled to a respective node of the control chain and two outputs coupled to the outputs of a respective element G0-G11, and further coupled to the loop nodes connected thereto, with each control circuit causing the resistance seen at the two loop nodes to be modified in relation to the signals at its input. It may also be appreciated that the control transistors T0-T11 of oscillator 400 comprise twelve respective control circuits, each of which has an input coupled to a respective node of the control chain and two outputs coupled to the outputs of a respective element G0-G11, and further coupled to the loop nodes connected thereto, with each control circuit causing the resistance seen at the two loop nodes to be modified in relation to the signals at its input. Finally, in oscillator 500 (FIG. 13), it may be appreciated that the twelve electrical connections from nodes N50-N61 to respective inputs of negative-resistance elements G0-G11 comprise twelve respective control circuits, each of which has an input coupled to a respective node of the control chain and an output coupled to a respective negative-resistance element, and which causes the resistance seen at a pair of adjacent loop nodes to be modified in relation to a signal at its input. Therefore, each of these control circuits may generally be described as having an input coupled to a node of the control chain, as being coupled to at least a node of the loop or a negative-resistance element, and as causing the resistance seen at a node (or present at a node) of the loop to be modified in relation to a signal at its input.

From the above description of oscillators 200, 300, 400, and 500, it may be appreciated that methods for starting the oscillation of the oscillator structure shown by oscillator 100 comprises deactivating the negative resistances seen at the loop nodes (and as provided by the negative resistance elements), and thereafter activating the negative resistances seen at the loop nodes in a sequential order. In the case of oscillators 200, 300, and 400, the step of deactivating the negative resistances seen at the loop nodes can be provided by adding positive resistances to the loop nodes, and the step of activating the negative resistances can be provided by removing the positive resistances in a sequential order. Also in the case of these oscillators, the step of deactivating the negative resistances seen at the loop nodes can be provided by clamping the voltages of the loop nodes, and the step of activating the negative resistances can be provided by unclamping the voltages of the loop nodes in a sequential order. In the case of oscillator 500, the step of deactivating the negative resistances seen at the loop nodes is provided by deactivating the negative-resistance elements, and the step of activating the negative resistances seen at the loop nodes is provided by activating the negative-resistance elements in a sequential order.

In addition, while we have shown that the activation and deactivation of the negative resistances seen at the loop nodes can be accomplished by introducing positive resistances to the loop nodes (as can be done in oscillators 200, 300, and 400) or by deactivating the negative-resistance elements G0-G11 (as is done in oscillator 500), it may be appreciated that both approaches may be done together in the same oscillator. For example, to deactivate the negative resistances, the bias signal to a number of the negative-resistance elements G0-G11, or all of them, may be reduced to reduce the magnitudes of the negative resistances at the elements' outputs, and positive resistances may be added to a number of the loop nodes, or to all of the loop nodes, by the control transistors. Also for example, to activate the negative resistances in sequential order, the bias signal to a number of the negative-resistance elements G0-G11, or all of them, may be increased to increase the magnitudes of the negative resistances at the elements' outputs, and positive resistances may be removed from a number of the loop nodes, or from all of the loop nodes, by the control transistors. It should therefore be understood that the claims of the application encompass these additional configurations.

While the present inventions have been particularly described with respect to the illustrated embodiments, it will be appreciated that various alterations, modifications and adaptations may be made based on the present disclosure, and are intended to be within the scope of the present inventions. While the inventions have been described in connection with what are presently considered to be the most practical and preferred embodiments, it is to be understood that the present inventions are not limited to the disclosed embodiments but, on the contrary, are intended to cover various modifications and equivalent arrangements included within the scope of the appended claims.

What is claimed is:

1. A multiphase electronic oscillator comprising:
   a loop of a first plurality of delay stages, the first plurality of delay stages being serially coupled to one another by a first plurality of nodes, the loop being folded to provide two concentric rings of delay stages;
   a plurality of negative-resistance elements, each element having a first output coupled to a node on the first concentric ring and a second output coupled to a node on the second concentric ring, each output of each negative-resistance element being capable of switching between a first voltage level and a second voltage level and presenting a negative resistance to a signal coupled to the output during at least a portion of a transition between voltage levels, the first and second voltage levels being opposite steady-state points, wherein each negative-resistance element has a bias to move the voltages at its outputs toward opposite steady-state points, and to switch one of its outputs to the opposite steady-state point when the other output is prompted to switch states by an external signal;
   a control chain of a second plurality of delay stages, the second plurality of delay stages being serially-coupled to one another by a second plurality of nodes, the control chain having a first terminal end and a second terminal end; and
   a plurality of control circuits, each control circuit having an input coupled to a node of the control chain, each control circuit being coupled to at least a node of the loop or a negative-resistance element and causing the resistance seen at a node of the loop to be modified in relation to a signal at its input.

2. The oscillator of claim 1, wherein the first plurality of delay stages comprises respective transmission lines.

3. The oscillator of claim 1, wherein at least one of the first plurality of delay stages comprises an inductor coupled between a pair of adjacent nodes of the first plurality of nodes and a capacitor coupled between one of the adjacent nodes and a potential.

4. The oscillator of claim 1 further comprising a plurality of variable capacitance elements coupled to respective ones of the first plurality of nodes.

5. The oscillator of claim 1, wherein at least one of the second plurality of delay stages comprises a pair of serially-coupled inverters.

6. The oscillator of claim 1, wherein at least one of the second plurality of delay stages comprises an interconnect wire.

7. The oscillator of claim 1, wherein at least one negative-resistance element comprises a pair of cross-coupled inverters.

8. The oscillator of claim 1 wherein each control circuit adds positive resistance to at least one respective node of the first plurality of nodes.

9. The oscillator of claim 1, wherein at least one control circuit comprises a first variable-conductance element and a second variable-conductance element, the first variable-conductance element having a first conduction terminal coupled to a source of potential, a second conduction terminal coupled to the first output of a respective negative-resistance element, and a modulation terminal to receive a signal that controls the conductance between its first and second conduction terminals, the second variable-conductance element having a first conduction terminal coupled to a source of potential, a second conduction terminal coupled to the second output of the respective negative-resistance element, and a modulation terminal to receive a signal that controls the conductance between its first and second conduction terminals, the modulation terminal of the first variable-conductance element being coupled to a first node of the second plurality of nodes, and the modulation terminal of the second variable-conductance element being coupled to a second node of the second plurality of nodes, the first and second nodes being different.

10. The oscillator of claim 9, wherein the first variable-conductance element comprises a transistor, and the second variable-conductance element comprises a transistor.

11. The oscillator of claim 1, wherein at least one control circuit comprises a first variable-conductance element and a second variable-conductance element, the first variable-conductance element having a first conduction terminal coupled to a source of potential, a second conduction terminal coupled to the first output of a respective negative-resistance element, and a modulation terminal to receive a signal that controls the conductance between its first and second conduction terminals, the second variable-conductance element having a first conduction terminal coupled to a source of potential, a second conduction terminal coupled to the second output of the respective negative-resistance element, and a modulation terminal to receive a signal that controls the conductance between its first and second conduction terminals, wherein the modulation terminals of the first and second variable-conductance elements are coupled to a first node of the second plurality of nodes.

12. The oscillator of claim 11, wherein the first variable-conductance element comprises a transistor, and the second variable-conductance element comprises a transistor.

13. The oscillator of claim 1, wherein at least one control circuit comprises a variable-conductance element, the first variable-conductance element having a first conduction terminal coupled to the first output of a respective negative-resistance element, a second conduction terminal coupled to the second output of the respective negative-resistance element, and a modulation terminal to receive a signal that controls the conductance between its first and second conduction terminals, the modulation terminal of the variable-conductance elements being coupled to a node of the second plurality of nodes.

14. The oscillator of claim 13, wherein the first variable-conductance element comprises a transistor, and the second variable-conductance element comprises a transistor.

15. The oscillator of claim 1, wherein at least one negative-resistance element comprises an input to receive a signal that controls the value of the resistance provided at its first and second outputs, the input signal capable of changing the resistance provided at each output from a negative value to a non-negative value, and wherein at least one control circuit comprises an electrical connection between the input of the at least one negative-resistance element and a node of the second plurality of nodes.

16. In a multiphase electronic oscillator comprising a loop of a first plurality of delay stages and a plurality of negative-resistance elements, the first plurality of delay stages being serially coupled to one another by a first plurality of nodes, the loop being folded to provide two concentric rings of delay stages, each negative-resistance element having a first output coupled to a node on the first concentric ring and a second output coupled to a node on the second concentric ring, each output of each negative-resistance element being capable of switching between a first voltage level and a second voltage level and presenting a negative resistance to a signal coupled to the output during at least a portion of a transition between voltage levels, the first and second voltage levels being opposite steady-state points, wherein each negative-resistance element has a bias to move the voltages at its outputs toward opposite steady-state points, and to switch one of its outputs to the opposite steady-state point when the other output is prompted to switch states by an external signal, a method of starting the oscillator comprising:

(a) deactivating the negative resistances seen at the loop nodes; and (b) thereafter activating the negative resistances seen at the loop nodes in a sequential order.

17. The method of claim 16, wherein the step of deactivating the negative resistances seen at the loop nodes comprises adding positive resistances to the loop nodes, and wherein the step of activating the negative resistances comprises removing the positive resistances in a sequential order.

18. The method of claim 16, wherein the step of deactivating the negative resistances seen at the loop nodes comprises clamping the voltages of the loop nodes, and wherein the step of activating the negative resistances comprises unclamping the voltages of the loop nodes in a sequential order.

19. The method of claim 16, wherein the step of deactivating the negative resistances seen at the loop nodes comprises deactivating the negative-resistance elements, and wherein the step of activating the negative resistances seen at the loop nodes comprises activating the negative-resistance elements in a sequential order.

20. The method of claim 16, wherein the step of deactivating the negative resistances seen at the loop comprises reducing the magnitudes of the negative resistances provided by the negative-resistance elements and adding positive resistances to the loop nodes, and wherein the step of activating the negative resistances comprises removing the positive resistances in a sequential order and increasing the magnitudes of the negative resistances provided by the negative-resistance elements in a sequential order.

* * * * *